United States Patent [19]
Connell et al.

[11] Patent Number: 5,173,474
[45] Date of Patent: Dec. 22, 1992

[54] SILICON SUBSTRATE HAVING AN EPITAXIAL SUPERCONDUCTING LAYER THEREON AND METHOD OF MAKING SAME

[75] Inventors: George A. N. Connell, Cupertino; David B. Fenner, Menlo Park; James B. Boyce, Los Altos; David K. Fork, Palo Alto, all of Calif.

[73] Assignees: Xerox Corporation, Stamford, Conn.; President and Board of Trustees of Santa Clara College, Santa Clara, Calif.; Board of Trustees of the Leland Stanford Junior University, Stanford, Calif.

[21] Appl. No.: 667,669

[22] Filed: Mar. 11, 1991

Related U.S. Application Data

[62] Division of Ser. No. 510,699, Apr. 18, 1990, abandoned.

[51] Int. Cl.$^5$ .............................................. C30B 25/18
[52] U.S. Cl. ........................................ 505/1; 505/701; 505/729; 505/730; 505/731; 505/732; 505/734; 156/610; 156/612
[58] Field of Search ............... 156/610, 612; 505/1, 505/701, 729, 730, 731, 732, 734

[56] References Cited

U.S. PATENT DOCUMENTS

| 4,837,609 | 6/1989 | Gurvitch ............................. 357/71 |
| 4,939,308 | 7/1990 | Maxfield et al. ..................... 505/1 |
| 4,940,693 | 7/1990 | Shappirio et al. .................... 505/1 |
| 4,980,339 | 12/1990 | Setsune et al. ..................... 505/701 |

FOREIGN PATENT DOCUMENTS

| 305292 | 3/1989 | European Pat. Off. ............ 505/729 |
| 322619 | 7/1989 | European Pat. Off. ............ 505/731 |
| 329103 | 8/1989 | European Pat. Off. . |
| 2617645A1 | 1/1989 | France . |
| 1-55880 | 3/1989 | Japan . |
| 1-57521 | 3/1989 | Japan . |
| 1-66978 | 3/1989 | Japan . |
| 1-89387 | 4/1989 | Japan . |
| 1-222443 | 9/1989 | Japan ............................. 505/731 |
| 2-389 | 1/1990 | Japan ............................. 505/731 |

OTHER PUBLICATIONS

AIDA et al "Preparation of $YBa_2Cu_3O_{7-x}$ Superconducting Thin Films by RF-Magnetron Sputtering" Jap. J. Appl. Phys. vol. 26(9) pp. L1489-91 (Sep. 1987).
Face et al "Preparation of Superconducting Thin Films of BiSrCaCuOs by Reactive Sputtering" *Appl. Phys. Lett* vol 53(3) pp. 246-248 (Jul. 18, 1988).
"In-situ growth of superconducting $YBa_2Cu_3O_y$ films by pulsed laser deposition", J. B. Boyce, G. A. N. Connell et al., Reprinted from "Processing of Films for High $T_c$ Superconducting Electronics", *SPIE—The International Society for Optical Engineering*, vol. 1187 Oct. 10-12 1989, Santa Clara, Calif.

(List continued on next page.)

*Primary Examiner*—Robert Kunemund
*Attorney, Agent, or Firm*—Townsend and Townsend

[57] ABSTRACT

An HTSC material epitaxially deposited on a YSZ buffer layer on a surface of a monocrystalline silicon substrate has a zero resistance transition temperature of at least 85° K., a transition width (10-90%) of no more than 1.0° K., a resistivity at 300° K. of no more than 300 micro-ohms-centimeter and a resistivity ratio (at 300° K./100° K.) of 3.0±0.2. The surface of the silicon substrate is cleaned using a spin-etch process to produce an atomically clean surface terminated with an atomic layer of an element such as hydrogen with does not react with silicon. The substrate can be moved to a deposition chamber without contamination. The hydrogen is evaporated in the chamber, and then YSZ is epitaxially deposited preferably by laser ablation. Thereafter, the HTSC material, such as YBCO, is epitaxially deposited preferably by laser ablation. The structure is then cooled in an atmosphere of oxygen.

32 Claims, 3 Drawing Sheets

"Heteroepitaxial Growth of Yttria-Stabilized Zirconia (YSZ) on Silicon", Hirofumi Fukumoto, Takeshi Imura and Ykio Osaka, *Japanese Journal of Applied Physics*, vol. 27, No. 8, Aug. 1988, pp. L1404–L1405.

"Superconducting $Y_1Ba_2Cu_3O_{7-x}$ films on Si", T. Venkatesan et al., *App. Phy. Lett 53(3)*, Jul. 18, 1988.

"Silicon surface passivation by hydrogen termination: A comparative study of preparation methods", D. B. Fenner et al., *J. Appl. Phys.* 66(1), Jul. 1, 1989.

"Highly oriented as-deposited superconducting laser ablated thin films of $Y_1Ba_2Cu_3O_{7-\delta}$ on $SrTiO_3$, zirconia, and Si substrates", G. Koren et al., *Appl. Phys. Lett.* 53(23), Dec. 5, 1988.

"Deposition and Characterization of Y–Ba–Cu O Thin Films on Silicon Substrates: Interface Analysis", D. B. Fenner et al., *Internat'l Conf. Materials and Mechanisms of Superconductivity High-Temperature Superconductors*, Stanford University Jul. 23–28, 1989.

"XPS Analysis of Y–Ba–Cu–O and Zr–O Thin Films and Interfaces With Silicon Substrates", D. B. Fenner et al., *Reactions at YBCO/Si MRS Meeting*, Nov. 1989.

"Silicon Surface Passivation For Heteroepitaxy By Hydrogen Termination", D. b. Fenner et al., *Mat. Res. Soc. Symp. Proc.* vol. 148, 1989.

Witanachchi et al, "As-Deposited Y–Ba–Cu–O Superconducting Films on Silicon At 400° C.", Applied Physics Letters vol. 54(6) Feb. 6, 1989 pp. 578–580.

Richards et al, "Feasibility of the High Tc Superconducting Bulometer", Applied Physics Letters vol. 54(3) Jan. 16, 1989, pp. 283–285.

SILICON SUBSTRATE HAVING AN EPITAXIAL SUPERCONDUCTING LAYER THEREON AND METHOD OF MAKING SAME

This application is a divisional application of Ser. No. 07/510,699, filed Apr. 18, 1990, now abandoned.

BACKGROUND OF THE INVENTION

This invention relates generally to semiconductor and superconductor technologies, and more particularly the invention relates to a silicon substrate such as an integrated circuit having a superconducting layer thereon. The invention further relates to a method of epitaxially forming on silicon a superconducting layer having good technological properties for electronic devices and circuit applications.

Much research is being pursued in the field of superconductivity in respect to the new classes of ceramic materials such as copper oxides combined with lanthanum, yttrium, barium, thallium, lead, bismuth, calcium, praesedinium, and strontium which have a relatively high superconductivity transition temperature ($T_c$). The yttrium, barium, and copper oxide materials ($Y_1Ba_2Cu_3O_7$) are referred to as 1-2-3 compounds and herein as YBCO.

Recently, work at Stanford University has been pursued to optimize the critical current density of superconducting materials. Materials have been yttrium barium and copper oxide perovskite compounds. The material has good superconducting properties at 77° K. and as a result can be used in combination with liquid nitrogen cooling. Thin film construction of the material is possible through vacuum deposition, either by electron-beam deposition or magnetron sputtering. Many of these planar films still show a limitation in critical current density due to random or non-preferred crystal orientation and grain boundary effects and atmospheric poisoning effects. When the films are deposited on single-crystal strontium titanate with a crystal orientation which is selected to be optimum, the deposited films orient themselves and grow epitaxially on the strontium titanate substrate after heat treatment. These films have exhibited critical current densities of 1.0 to $1.5 \times 10^6$ amperes per square centimeter at 4.2K which is exceptionally good.

The formation of high temperature superconductor material on silicon substrates has been a recognized goal of researchers for years. Silicon integrated circuits are operable at superconducting temperatures (at present as high as 125° K.). A limitation in realizing ultra high speed semiconductor ICs lies in the interconnection of various circuits in the semiconductor substrate. Conventionally this is accomplished by metal interconnect layers on the surface of the semiconductor substrate. By reducing the resistance of the interconnect metallization, circuit speed of operation can be enhanced.

Superconducting material such as YBCO cannot be deposited directly on silicon because the chemical reaction of silicon with YBCO either completely destroys the superconductivity of the material or significantly depresses the superconducting transition temperature. Numerous attempts have been made in using barrier layers between the silicon and the superconducting material to prevent chemical reactions yet allow the growth of a highly oriented high temperature semiconductor film with a high superconducting temperature. Barrier layers heretofore used include oxides of silicon, zirconium, magnesium, strontium and titanium, magnesium and aluminum, aluminum, lanthanum and aluminum, and others. Yttria stabilized zirconia (YSZ) has been proposed as a barrier layer. However, the superconducting material using these barriers has not had the technological properties necessary for practical utilization. Two of the problems encountered in using these barrier materials lie in contamination from the silicon substrate and oxidation of the silicon substrate during processing.

The present invention provides a silicon substrate having a high temperature superconductor layer epitaxially formed thereon which has the properties necessary for practical applications.

SUMMARY OF THE INVENTION

Accordingly, an object of the invention is a structure including a silicon substrate and a high temperature superconducting layer thereon having requisite properties for practical applications.

Another object of the invention is a process for fabricating high temperature superconducting layers on silicon substrates using a barrier which facilitates the epitaxial formation of the superconducting material.

Another object of the invention is a high temperature superconducting interconnect for a silicon integrated circuit which exhibits a zero resistance transistion temperature of at least 85° K. with a superconducting transition width (10–90%) of 1.0° K. or less and has resistivity at 300° K. of 300 micro-ohm-centimeter or less and a resistivity ratio (at 300° K./100° K.) of $3.0 \pm 0.2$.

Another object of the invention is an integrated electronic circuit such as an infrared detector array and signal processing and control electronics which uses an integrated silicon circuit for signal processing and for control of a high-temperature superconducting device array such as a bolometric infrared detector array.

Still another object of the invention is a silicon integrated circuit using high temperature superconducting interconnections and/or superconducting microwave devices and resonators.

Briefly, in fabricating a structure in accordance with the invention a monocrystalline silicon substrate having a major surface is provided. The major surface is cleaned using a spin-etch process to produce an atomically clean surface terminated with an atomic layer of an element which does not react with silicon so as to disrupt the crystallinity of the surface and can be readily removed by heating the silicon.

Thereafter, the substrate is transferred to a deposition chamber and heated to evaporate the element from the surface of the silicon substrate, and a buffer layer of YSZ is deposited on the major surface while the substrate remains in the deposition chamber. The YSZ forms epitaxially on the major surface. Next, a high temperature superconducting material is deposited on the buffer layer while the substrate remains in the deposition chamber, the high temperature superconducting material forming epitaxially on the buffer layer of YSZ.

In a preferred embodiment the high temperature superconducting material comprises YBCO. Other oxide superconductors besides Y-Ba-Cu in a 1-2-3 or 2-4-8 ratio can be prepared. Any of the rare earth elements can be substituted for Y in the above compounds. Also some or all of the Ba can be replaced by Ca or Sr. In addition, some of the Cu can be replaced by transition metals and by Zn and Ga. Other oxide superconductors that could be deposited include the many Bi- Ca-Sr-Cu and Tl-Ba-Ca-Cu systems and their variants. The Ba (Pb, Bi) $O_3$, (Ba, K) $BiO_3$ and the n-type superconductors, such as, $Nd_{2-x}Ce_xCuO_{4-y}$ could also be prepared. The YBCO and the YSZ materials can be deposited by laser ablation, by sputtering techniques, by e-beam deposition, by evaporation, by molecular beam epitaxy, or by the forms of chemical vapor deposition.

In accordance with one embodiment of the invention, a silicon substrate having a 1-0-0 crystallographic orientation is used, and the buffer layer of YSZ forms a cubic structure thereon. The YBCO film formed thereon has excellent crystal epitaxy with the underlying silicon crystal as required for electronic devices and circuit applications.

The process is readily implemented, and the resulting structures are compatible with silicon integrated technology.

The invention and objects and features thereof will be more readily apparent from the following detailed description and appended claims when taken with the drawing.

DETAILED DESCRIPTION OF ILLUSTRATIVE EMBODIMENTS

Figure 1A:
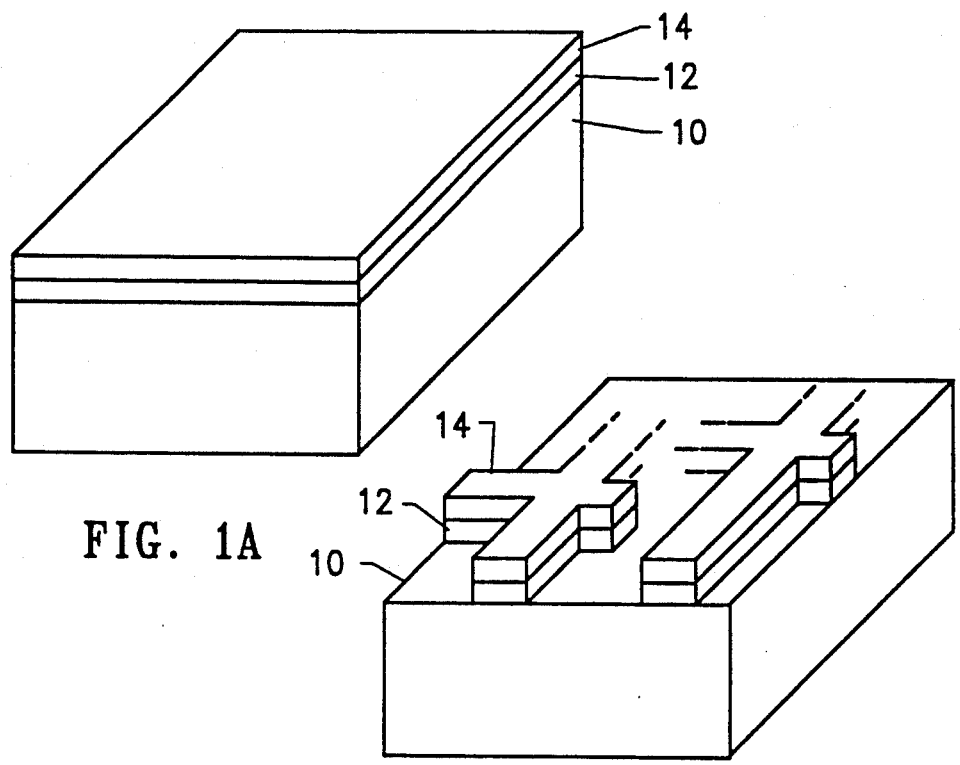
FIG. 1A is a perspective view of a structure in accordance with the invention including a silicon substrate, a buffer layer, and a high temperature superconductor layer thereon.
Figure 1B:
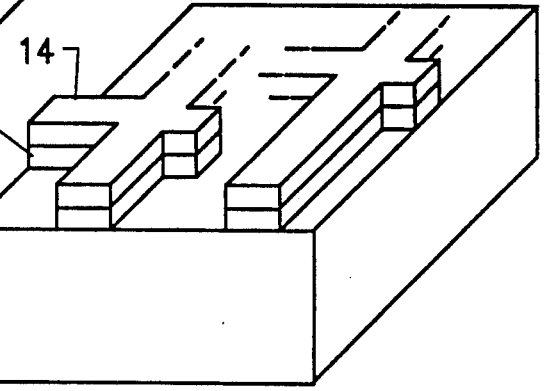
FIG. 1B is a perspective view of the structure of FIG. 1 in which the silicon substrate comprises an integrated circuit, and the high temperature superconductor layer is selectively etched to form an interconnect pattern for the circuit.

Referring now to the drawing, FIG. 1A is a perspective view of a monolithic silicon substrate 10 on which is formed an epitaxial heterojunction barrier layer 12 of YSZ and an epitaxial deposited layer of YBCO 14 in accordance with one embodiment of the invention. By employing a process in accordance with the invention, the resulting superconducting layer of YBCO exhibits a zero resistance transition temperature of at least 85° K. and a transition width (10–90%) of no greater than 1.0° K. The resistivity of the superconducting material at 300° K. is no greater than 300 micro-ohm-centimeter and the resistivity ratio (at 300° K./100° K.) is 3.0±0.2. Accordingly, the superconducting layer lends itself to providing an interconnection pattern for an integrated circuit in the silicon substrate as illustrated in the isometric view of FIG. 1B. In forming the interconnect pattern the YBCO can be selectively etched using photolithographic masking and etching techniques with nitric acid, hydrochloric acid, phosphoric acid, bromine and alcohol, or laser ablation as an etchant. The underlying YSZ is selectively removed by ion milling, by plasma etch, or by laser ablation.

Figure 2A:
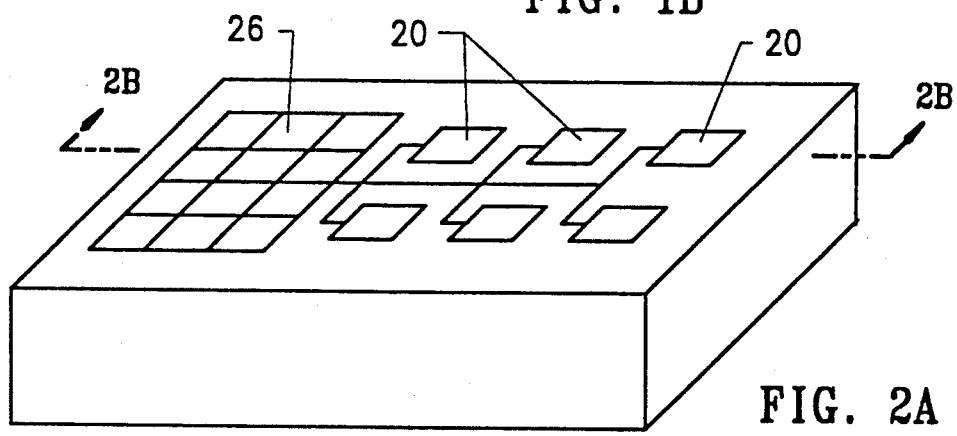
FIG. 2A is a perspective view of an integrated electronic circuit which uses silicon circuitry for signal processing and for control of a high-temperature device array.
Figure 2B:
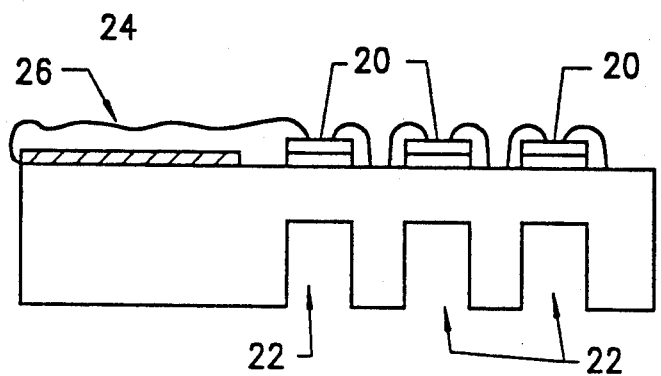
FIG. 2B is a cross-sectional view of the circuit.

FIGS. 2A and 2B are a perspective view and a cross-sectional view of another illustrative embodiment of bolometric infrared detectors comprising HTSC material 20 formed in accordance with the invention over recessed areas 22 in a silicon substrate 24. An integrated circuit 26 is formed in an end portion of the substrate 24.

Figure 3:
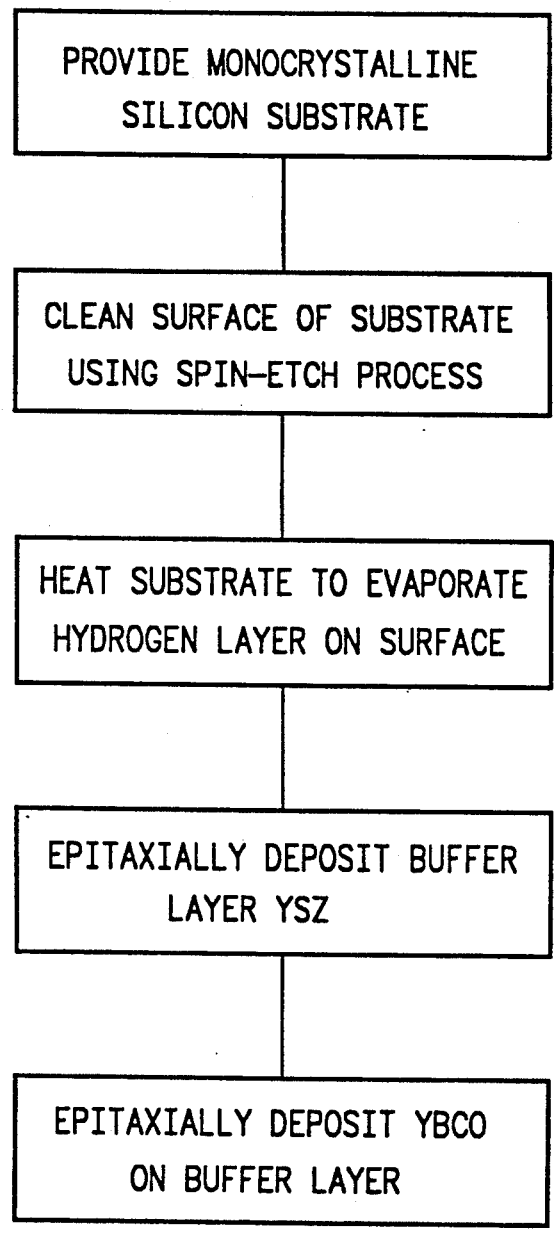
FIG. 3 is a flow diagram illustrating steps in fabricating a structure in accordance with the invention.

The good technological properties of the superconducting material formed on the silicon substrate results from the unique process in forming the barrier layer and the superconducting layer on the silicon substrate. FIG. 3 is a flow diagram of process steps in carrying out the invention using YSZ as the buffer layer and YBCO as the superconducting layer on the YSZ.

First, a monocrystalline silicon substrate having a 1-0-0 crystallographic orientation is provided. The silicon substrate can comprise an integrated circuit, for example. A major surface of the substrate is stripped of all oxide, either intentionally grown oxides or native oxides, by the following process. A standard degreasing procedure is followed by a spin-etch treatment in flowing nitrogen. In this treatment, the silicon wafer is rotated, flushed with a few drops of high purity alcohol and then etched with a few pipetted drops of a (1:10:1) mixture of HF, ethanol and water, all of high purity. The spin-etch technique produces an atomically clean surface terminated with one atomic layer of hydrogen. The surface is then very passive to contamination or re-oxidation, even in air, and silicon wafers can be brought to the point of film deposition with highly ideal surfaces.

The spin-etch technique for cleaning and terminating the surface of the substrate is described in Fenner et al. "Silicon Surface Passivation by Hydrogen Termination: A Comparative Study of Preparation Methods", *Journal of Applied Physics* 66(1), July 1989, 419-424. As described therein, the wafer surface oxide is etched using an HF-Alcohol reagent in a flowing nitrogen atmosphere at room temperature while the wafer is spinning.

Figure 4A:
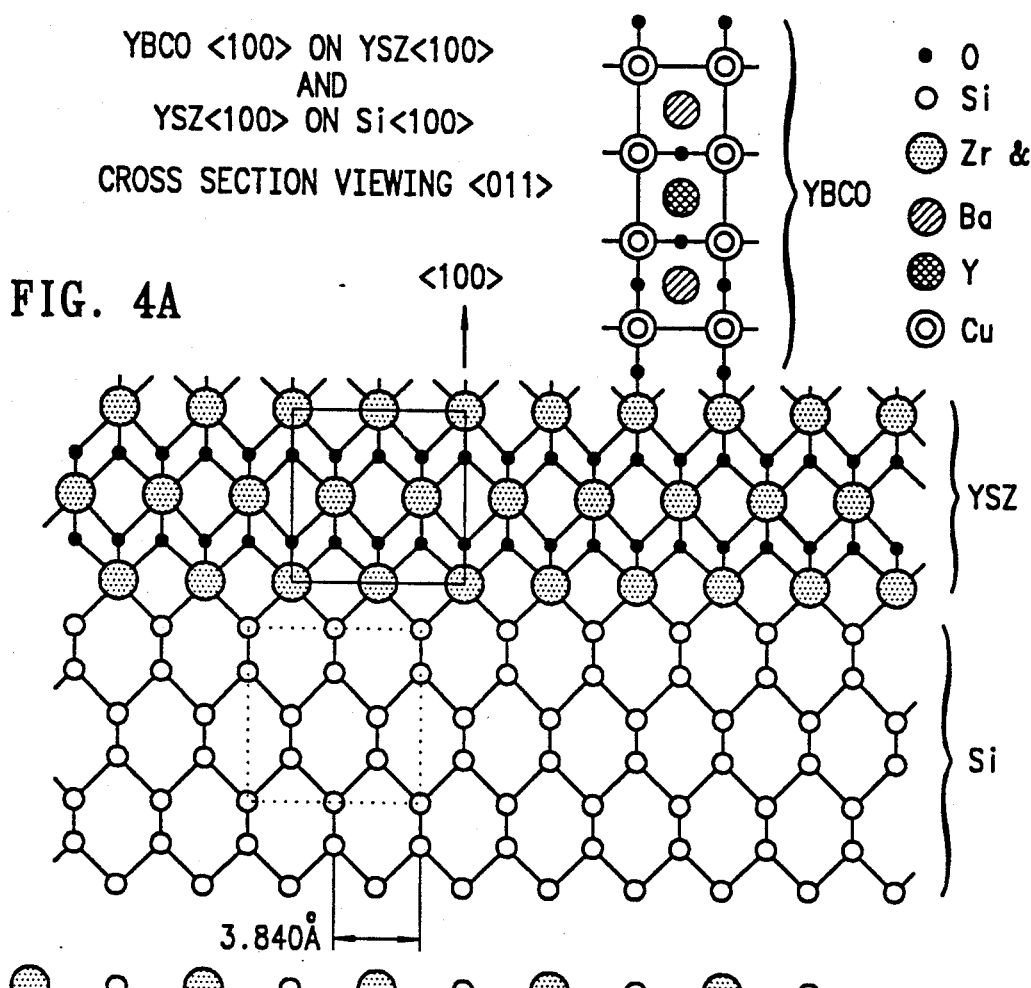
FIG. 4A is a crystal lattice model of the crystal silicon and YSZ structures at the interface for the preferred embodiment.
Figure 4B:
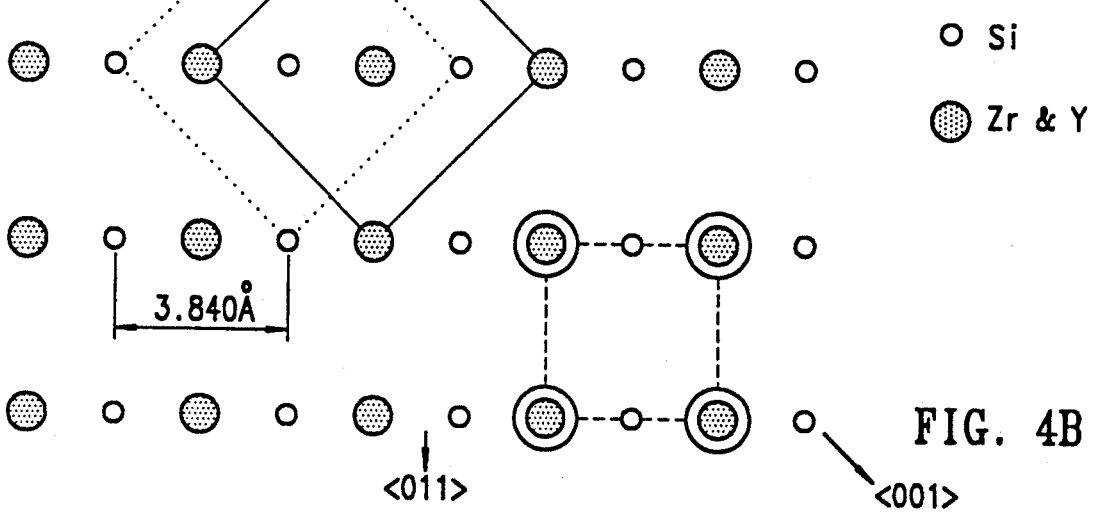
FIG. 4B is a top plan view illustrating the crystallographic orientations of the materials.

Thereafter, the substrate is moved to a deposition chamber and is heated to about 800° C. in a moderate vacuum (e.g. $10^{-6}$ Torr) which evaporates the hydrogen from the surface. Preferably, the substrate is first raised to approximately 250° C. to remove weakly bound adsorbed impurities before heating the substrate to approximately 800° C. The YSZ layer is then epitaxially deposited on the substrate surface using laser ablation, sputtering techniques, e-beam evaporation, thermal evaporation, molecular beam epitaxy or by the form of chemical vapor deposition. The laser ablation technique is described by Fork et al. in "Applied Physics Letters," 53,337 (1988). Briefly, a laser beam is focused onto a pressed YSZ target. The laser most often used is an excimer laser producing intense pulses in the ultraviolet (UV) region. Other UV lasers, such as, tripled Nd:YAG, can also be used as well as lasers providing pulses of light in other regions of the electromagnetic spectrum, such as, pulsed $CO_2$ lasers. The targets used are made by grinding appropriate mixtures of $ZrO_2$ and $Y_2O_3$ in an agate mortar and pestle and impressing 0.5 inch diameter disks at 50,000 psi. The disks are then sintered for 36 hours at 1,000° C. in flowing oxygen. YSZ films may also be produced from separate similarly pressed targets of $ZrO_2$ and $Y_2O_3$ and pulsing them in the required ratio. Films made from the YSZ pressed pellets produce smoother featureless films as compared with YSZ films made from the separate ZrO$_2$ and Y$_2$O$_3$ targets with current procedures. The laser heats the target surface, producing a plume of Y, Zr and O atoms which land on the nearby substrate. The film is grown in a pulse by pulse fashion; several hundred to several thousand pulses are needed to grow a thin film, up to 250 nm in thickness. After depositing the first few layer equivalents of the buffer film of YSZ, oxygen gas is introduced into the chamber to a low pressure, e.g. $5 \times 10^{-4}$ Torr. A highly textured (100) cubic-fluorite structured YSZ film is formed epitaxially on the single crystal silicon surface as is shown in FIG. 4A and FIG. 4B.

Immediately after the buffer film has been deposited, the silicon is cooled to about 750° C., and the oxygen pressure is raised to about 200 milli Torr and the YBCO film is deposited by laser ablation method. With changes in silicon substrate temperature and oxygen pressure YBCO could be deposited by sputtering, by e-beam deposition, by evaporation, by molecular beam epitaxy, or by the forms of chemical vapor deposition. Laser ablation of YBCO is described by Koren et al. in "Highly Oriented As-Deposited Superconducting Laser Ablated Thin Films of Y$_1$Ba$_2$Cu$_3$O$_7$ on SrTiO$_3$, Zirconia, and Si Substrates", *Applied Physics Letter* 53(23) Dec. 5, 1988. The YBCO compound can be 1-2-3, 2-4-8, or other combinations depending on pulsing variations in the ablation technique.

Other oxide superconductors besides Y-Ba-Cu in a 1-2-3 or 2-4-8 ratio can be prepared. Any of the rare earth elements can be substituted for Y in the above compounds. Also some or all of the Ba can be replaced by Ca or Sr. In addition, some of the Cu can be replaced by transition metals and by Zn and Ga. Other oxide superconductors that could be deposited include the many Bi-Ca-Sr-Cu and Tl-Ba-Ca-Cu systems and their variants. The Ba (Pb, Bi) O$_3$, (Ba, K) BiO$_3$ and the n-type superconductors, such as, Nd$_{2-x}$Ce$_x$CuO$_{4-y}$ could also be prepared.

After the desired thickness of YBCO film is deposited, the substrate is cooled at a controlled rate in an oxygen atmosphere to prevent reduction of the film. The YBCO film is a high quality superconductor in having good electrical resistivity properties. FIG. 4A is the in-plane epitaxial orientation of the YBCO on YSZ where the in-plane (100) direction of the YBCO is parallel to the in-plane (110) of the YSZ which leads to the superior crystal quality of the aforementioned YBCO on YSZ. FIG. 4A also illustrates the in-plane epitaxial orientation of the YSZ on silicon where the in-plane (100) direction of the YSZ is parallel to the in-plane (100) direction of the silicon which leads to the superior crystal quality of aforementioned YSZ on silicon. FIG. 4B is a top plan view illustrating the crystallographic orientations of the materials. Therefore both the YSZ buffer and YBCO films have excellent crystal epitaxy with the silicon crystal.

Transmission electron micrographs reveal coherent growth of the YSZ on the silicon and of the YBCO on the YSZ, highly textured (100) cubic-fluorite structure YSZ, and YBCO with a high degree of C-axis orientation. X-ray diffraction of the films indicates a high degree of in plane epitaxial orientation for both films with the YSZ having cubic-fluorite structure exclusively and the YBCO having C-axis orientation. The zero resistance transition temperature and transition width along with the resistivity at 300° K. and the resistivity ratio prove that the superconducting material had good technological properties for integrated circuit applications and other superconducting environment applications.

While the invention has been described with reference to a specific embodiment, the description is illustrative of the invention and is not to be construed as limiting the invention. For example, the YSZ film can grow on silicon surfaces having other crystallographic orientations (such as 111) by laser ablation deposition. Further, other superconducting material can be deposited using the process in accordance with the invention.

Other oxide superconductors besides Y-Ba-Cu in a 1-2-3 or 2-4-8 ratio can be prepared. Any of the rare earth elements can be substituted for Y in the above compounds. Also some or all of the Ba can be replaced by Ca or Sr. In addition, some of the Cu can be replaced by transition metals and by Zn and Ga. Other oxide superconductors that could be deposited include the many Bi-Ca-Sr-Cu and Tl-Ba-Ca-Cu systems and their variants. The Ba (Pb, Bi) O$_3$, (Ba, K) BiO$_3$ and the n-type superconductors, such as, Nd$_{2-x}$Ce$_x$CuO$_{4-y}$ could also be prepared.

Accordingly, various modifications and applications may occur to those skilled in the art without departing from the true spirit and scope of the invention as defined by the appended claims.

We claim:

1. A method of forming a high temperature superconducting layer on a silicon substrate comprising the steps of
   a) providing a monocrystalline silicon substrate having a major surface,
   b) cleaning said major surface using a spin-etch process to produce an atomically clean surface terminated with an atomic layer of an element which does not react with silicon so as to disrupt the surface crystallinity,
   c) heating said substrate in a deposition chamber to evaporate said element,
   d) depositing a buffer layer of YSZ on said major surface while said substrate remains in said deposition chamber, said YSZ forming epitaxially on said major surface of monocrystalline silicon, and
   e) depositing a high temperature superconducting material on said buffer layer while said substrate remains in said deposition chamber, said high temperature superconductor material forming epitaxially on said buffer layer of YSZ.

2. The method as defined by claim 1 wherein said YSZ forms epitaxially with the in-plane (100) direction of said YSZ layer being parallel to the in-plane (100) direction of said monocrystalline silicon.

3. The method as defined by claim 1 wherein said element is hydrogen.

4. The method as defined by claim 3 wherein step c) includes heating said substrate to approximately 800° C. in a vacuum of approximately $10^{-6}$ Torr.

5. The method as defined by claim 4 wherein step c) further includes heating said substrate to approximately 250° C. to remove weakly bound adsorbed impurities prior to heating said substrate to approximately 800° C.

6. The method as defined by claim 5 wherein step d) includes initially depositing YSZ in said vacuum of approximately $10^{-6}$ Torr and then introducing oxygen into said chamber.

7. The method as defined by claim 6 wherein the introduction of oxygen is at a pressure of approximately $5 \times 10^{-4}$ Torr.

8. The method as defined by claim 7 wherein said major surface of silicon has a 1-0-0 crystallographic orientation, and said step of depositing a buffer layer forms YSZ having a cubic structure.

9. The method as defined by claim 8 wherein step d) includes laser ablation.

10. The method as defined by claim 8 wherein step d) includes sputtering.

11. The method as defined by claim 8 wherein step d) includes chemical vapor deposition.

12. The method as defined by claim 8 wherein step d) includes molecular beam epitaxy.

13. The method as defined by claim 8 wherein step d) includes e-beam epitaxy.

14. The method as defined by claim 8 wherein step d) includes thermal evaporation.

15. The method as defined by claim 8 wherein step e) includes reducing the temperature of said silicon substrate to approximately 750° C., increasing oxygen pressure to approximately 200 milli Torr, and then depositing YBCO high temperature superconducting material.

16. The method as defined by claim 8 wherein the in-plane YBCO(100) direction is parallel to the in-plane silicon (110) direction.

17. The method as defined by claim 15 wherein step e) includes laser ablation.

18. The method as defined by claim 15 wherein step e) includes sputtering.

19. The method as defined by claim 15 wherein step d) includes chemical vapor deposition.

20. The method as defined by claim 15 wherein step d) includes molecular beam epitaxy.

21. The method as defined by claim 15 wherein step d) includes e-beam epitaxy.

22. The method as defined by claim 15 wherein step d) includes thermal evaporation.

23. The method as defined by claim 15 and further including following step e) the steps of filling said chamber with 200–500 Torr of oxygen and then cooling said silicon substrate at a controlled rate.

24. The method as defined by claim 23 wherein step c) further includes heating said substrate to approximately 250° C. to remove weakly bound adsorbed impurities prior to heating said substrate to approximately 800° C.

25. The method as defined by claim 1 wherein said silicon substrate is an integrated circuit and further including the steps of selectively etching said high temperature superconducting material to form an interconnect for said integrated circuit.

26. The method as defined by claim 1 wherein said silicon substrate is an integrated circuit and further including the steps of selectively etching said high-temperature superconducting material to form an array of superconducting devices such as bolometric infrared detectors connected with and controlled by said integrated circuit.

27. The method as defined by claim 1 wherein step d) includes sputtering.

28. The method as defined by claim 1 wherein step d) includes chemical vapor deposition.

29. The method as defined by claim 1 wherein step d) includes molecular beam epitaxy.

30. The method as defined by claim 1 wherein step d) includes e-beam epitaxy.

31. The method as defined by claim 1 wherein step d) includes thermal evaporation.

32. The method as defined by claim 1 wherein said high temperature superconducting material has a zero resistance transition temperature of at least 85° K. and a transition width (10–90%) of no more than 1.0° K. and a resistivity at 300° K. of no more than 300 micro-ohm-centimeter and a resistivity ratio (at 300° K./100° K.) of $3.0 \pm 0.2$.

* * * * *